(12) United States Patent
Adkisson et al.

(10) Patent No.: US 7,675,097 B2
(45) Date of Patent: Mar. 9, 2010

(54) SILICIDE STRAPPING IN IMAGER TRANSFER GATE DEVICE

(75) Inventors: James W. Adkisson, Jericho, VT (US); John J. Ellis-Monaghan, Grand Isle, VT (US); R. Michael Guidash, Rochester, NY (US); Mark D. Jaffe, Shelburne, VT (US); Edward T. Nelson, Pittsford, NY (US); Richard J. Rassel, Colchester, VT (US); Charles V. Stancampiano, Rochester, NY (US)

(73) Assignees: International Business Machines Corporation, Armonk, NY (US); Eastman Kodak Company, Rochester, NY (US)

( * ) Notice: Subject to any disclaimer, the term of this patent is extended or adjusted under 35 U.S.C. 154(b) by 403 days.

(21) Appl. No.: 11/565,801

(22) Filed: Dec. 1, 2006

(65) Prior Publication Data

US 2008/0128767 A1    Jun. 5, 2008

(51) Int. Cl.
*H01L 27/146* (2006.01)
(52) U.S. Cl. ............................... 257/292; 257/E31.124
(58) Field of Classification Search ......... 257/291–292, 257/E31.638–E31.64, E31.124
See application file for complete search history.

(56) References Cited

U.S. PATENT DOCUMENTS

| 2004/0262651 | A1* | 12/2004 | Mouli | ........................ 257/290 |
| 2005/0045926 | A1 | 3/2005 | Mouli | |
| 2005/0133825 | A1 | 6/2005 | Rhodes et al. | |
| 2006/0014352 | A1 | 1/2006 | Rhodes | |
| 2006/0022233 | A1 | 2/2006 | Rhodes | |
| 2006/0105489 | A1 | 5/2006 | Rhodes | |

(Continued)

FOREIGN PATENT DOCUMENTS

EP    0 798 785    10/1997

(Continued)

OTHER PUBLICATIONS

Dual-Material Gate (DMG) Field Effect Transistor by Wei Long, et al., IEEE Transactions on Electron Devices, vol. 46, No. 5, May 1999, pp. 865-870.

(Continued)

*Primary Examiner*—Jerome Jackson, Jr.
*Assistant Examiner*—Paul A Budd
(74) *Attorney, Agent, or Firm*—Scully, Scott, Murphy & Presser, P.C.; Anthony J. Canale

(57) ABSTRACT

A CMOS active pixel sensor (APS) cell structure having dual workfunction transfer gate device and method of fabrication. The transfer gate device comprises a dielectric layer formed on a substrate and a dual workfunction gate conductor layer formed on the dielectric layer comprising a first conductivity type doped region and an abutting second conductivity type doped region. The transfer gate device defines a channel region where charge accumulated by a photosensing device is transferred to a diffusion region. A silicide structure is formed atop the dual workfunction gate conductor layer for electrically coupling the first and second conductivity type doped regions. In one embodiment, the silicide contact is smaller in area dimension than an area dimension of said dual workfunction gate conductor layer. Presence of the silicide strap prevents the diodic behavior from allowing one or the other side of the gate to float to an indeterminate voltage.

24 Claims, 5 Drawing Sheets

U.S. PATENT DOCUMENTS

2006/0118835 A1 6/2006 Ellis-Monaghan et al.
2006/0124976 A1 6/2006 Adkisson et al.

FOREIGN PATENT DOCUMENTS

| EP | 1 139 428 | 10/2001 |
| WO | 2008/069994 | 6/2008 |

OTHER PUBLICATIONS

International Search Report and Written Opinion of the International Searching Authority, mailed Jul. 4, 2008, International Application No. PCT/US2007/024684.

* cited by examiner

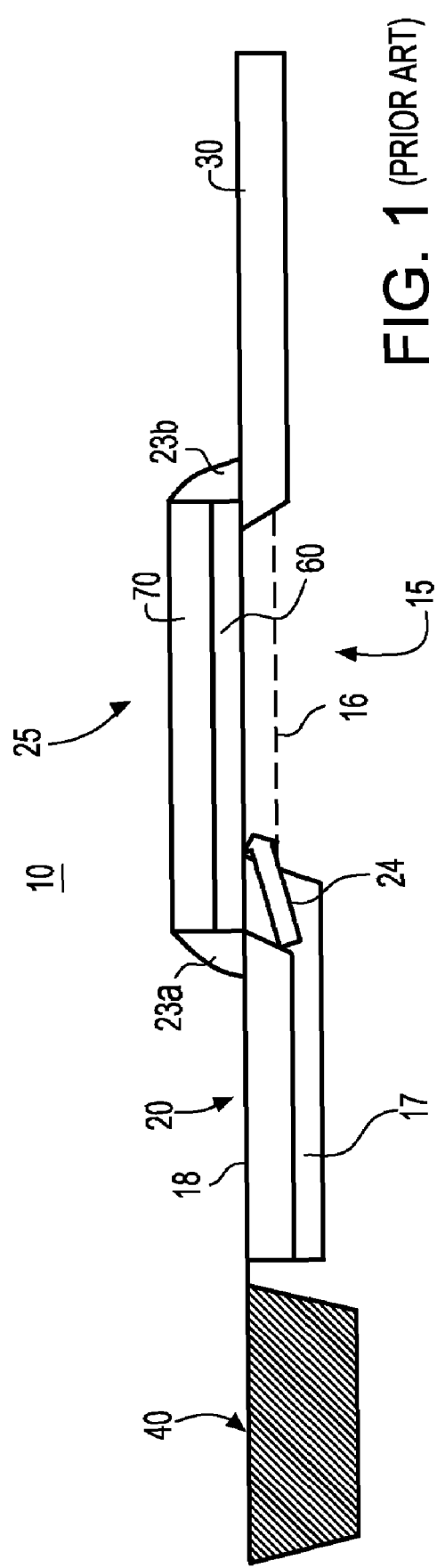
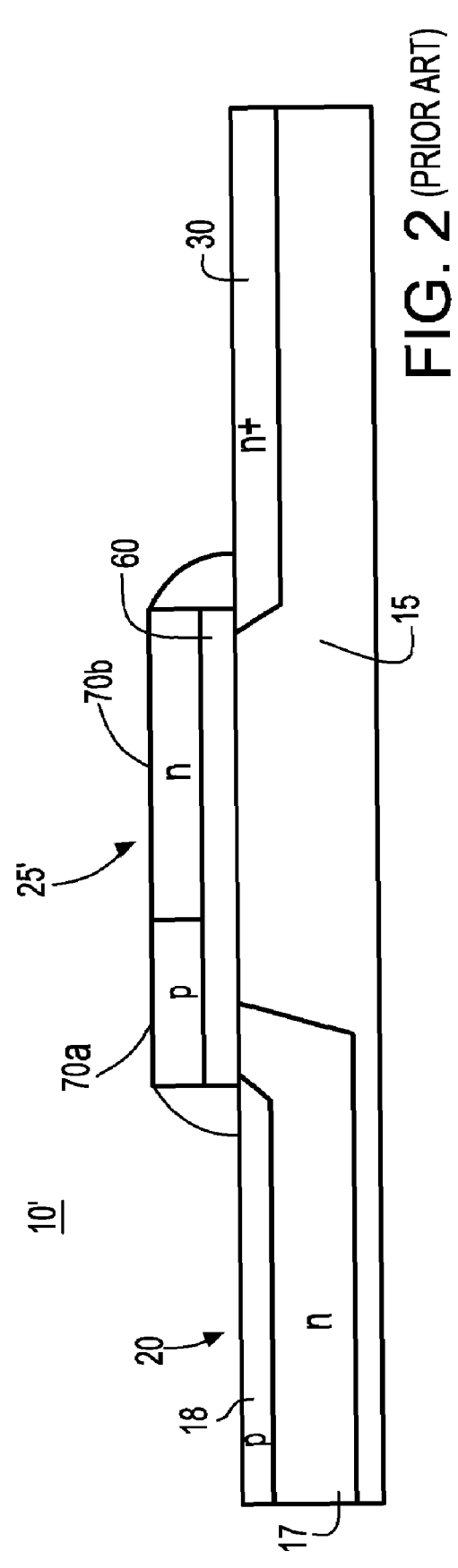

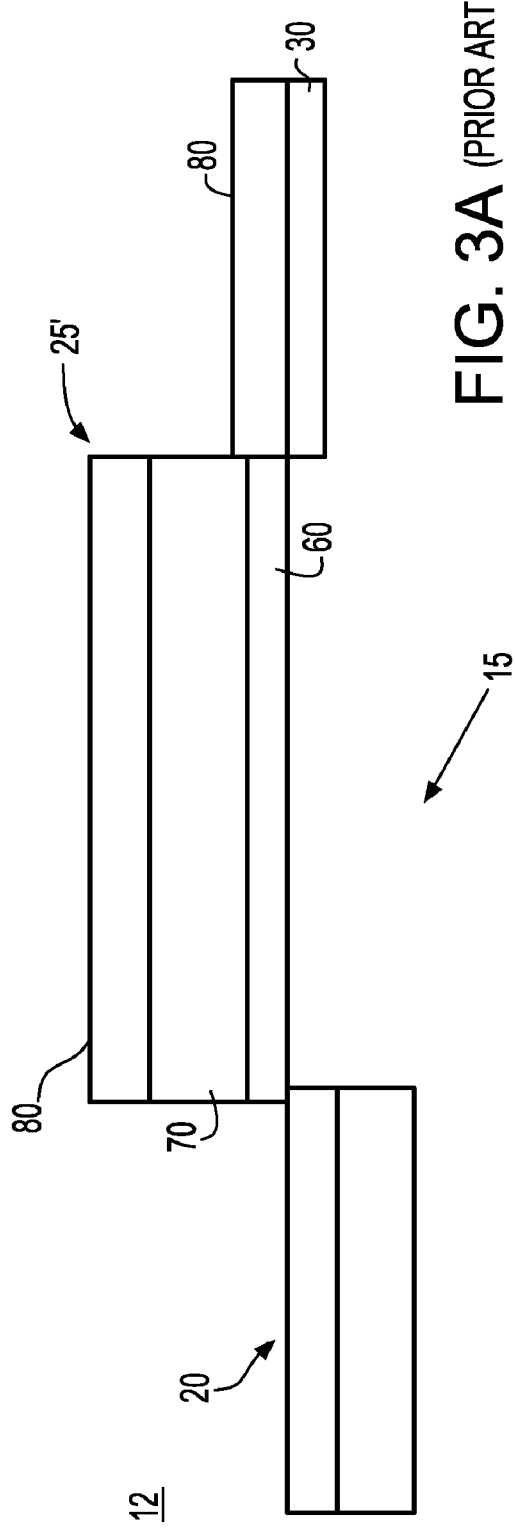
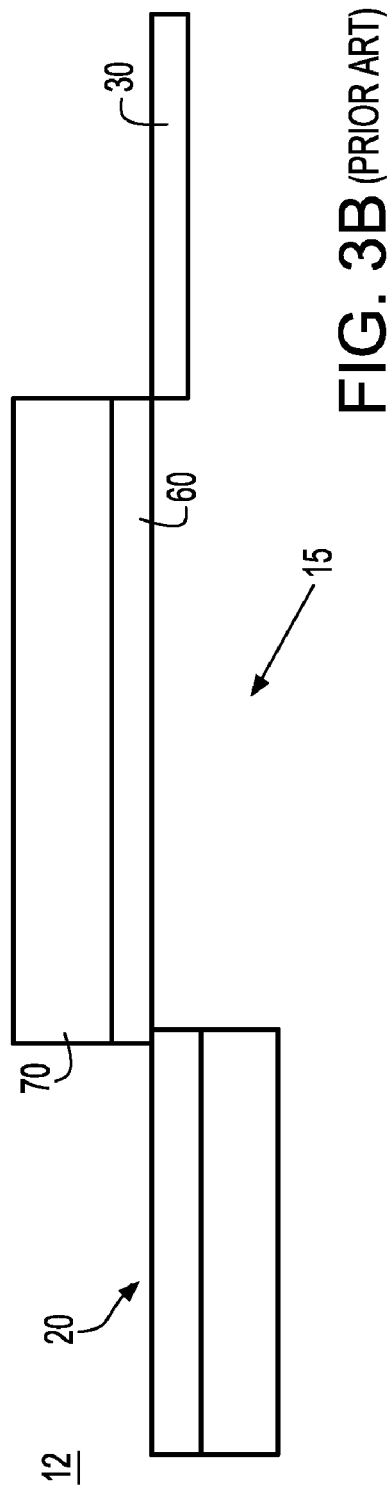

SILICIDE STRAPPING IN IMAGER TRANSFER GATE DEVICE

FIELD OF THE INVENTION

The present invention relates to semiconductor optical image sensors, and particularly, to a novel CMOS (complementary metal oxide semiconductor) image sensor cell structure exhibiting reduced lag, higher capacity and lower dark current.

DESCRIPTION OF THE PRIOR ART

CMOS image sensors are beginning to replace conventional CCD sensors for applications requiring image pick-up such as digital cameras, mobile telephones, cellular telephones, pervasive digital devices such as PDA's (personal digital assistant), personal computers, medical devices, and the like. Advantageously, CMOS image sensors are fabricated by applying present CMOS fabricating process for semiconductor devices such as photodiodes or the like, at low costs. Furthermore, CMOS image sensors can be operated by a single power supply so that the power consumption for that can be restrained lower than that of CCD sensors, and further, CMOS logic circuits and like logic processing devices are easily integrated in the sensor chip and therefore the CMOS image sensors can be miniaturized.

Current CMOS image sensors comprise an array of CMOS Active Pixel Sensor (APS) cells, which are used to collect light energy and convert it into readable electrical signals. Each APS cell comprises a photosensitive element, such as a photodiode, photogate, or photoconductor overlying a doped region of a substrate for accumulating photo-generated charge in an underlying portion thereof. A read-out circuit is connected to each pixel cell and often includes a diffusion region for receiving charge from the photosensitive element, when read-out. Typically, this is accomplished by a transistor device having a gate electrically connected to the floating diffusion region. The imager may also include a transistor, having a transfer gate, for transferring charge from the photosensitive element across a channel to the floating diffusion region, and a transistor for resetting the floating diffusion region to a predetermined charge level prior to charge transfer.

As shown in FIG. 1, a typical CMOS APS cell 10 includes a pinned photodiode 20 having a pinning layer 18 doped p-type and, an underlying lightly doped n-type region 17. Typically, the pinned diode 20 is formed on top of a p-type substrate 15 or a p-type epitaxial layer or p-well surface layer having a lower p-type concentration than the diode pinning layer 18. As known, the surface doped p-type pinning layer 18 is in electrical contact with the substrate 15 (or p-type epitaxial layer or p-well surface layer). The photodiode 20 thus has two p-type regions 18 and 15 having a same potential so that the n-type doped region 17 is fully depleted at a pinning voltage (Vp). That is, the surface pinning layer 18 is in electrical contact to the substrate. The pinned photodiode is termed "pinned" because the potential in the photodiode is pinned to a constant value, Vp, when the photodiode is fully depleted. This pinned photodiode configuration improves the device performance by decreasing dark current (current output by a pixel in a dark environment). However, the pinned photodiode configuration may cause image lag due to the incomplete transfer of charge from the photodiode to the floating node.

As further shown in FIG. 1, the n-type doped region 17 and p region 18 of the photodiode 20 are spaced between an isolation region, e.g., a shallow trench isolation (STI) region 40, and a charge transfer transistor gate 25 which is surrounded by thin spacer structures 23a,b. The shallow trench isolation (STI) region 40 is located proximate the pixel image cell for isolating the cell from an adjacent pixel cell. In operation, light coming from the pixel is focused down onto the photodiode through the diode where electrons collect at the n-type region 17. When the transfer gate 25 is operated, i.e., turned on by applying a voltage to the transfer gate 25 comprising, for example, an n-type doped polysilicon layer 70 over a thin dielectric layer 60, the photo-generated charge 24 is transferred from the charge accumulating doped n-type doped region 17 via a transfer device channel 16 to a floating diffusion region 30, e.g., a floating "node" doped n+ type.

FIG. 2 depicts a further prior art CMOS APS cell 10' having incorporated a gate 25' having a portion that is p-type material 70a and a portion that is n-type 70b. The n-type portion 70b of the gate has a lower Vt and the p-type portion 70a of the gate has a higher Vt. By having both present in the gate at the same time, the transfer gate has a built in field pulling electrons from the photodiode to the floating diffusion. Additionally, in the design of the CMOS APS cell 10' it has been noticed that the presence of silicide contact regions (not shown) formed over the floating node diffusions, in the array, causes a bright point defect leakage problem. That is, due to the additional presence of formed silicide contacts over these diffusions, it has been found that occasional pixels see silicide "spikes" which leak current at levels high enough to make that pixel unusable. As a result, silicide has been removed from the arrays of CMOS imagers for bright point yield.

FIG. 3A depicts a CMOS imager 12 having a silicide layer blocked from the photodiode surface since silicide blocks light while a silicide layer 80 formed over the transfer gate polysilicon and floating diffusion remain. FIG. 3B illustrates the CMOS imager 12 of FIG. 3A having silicide layers 80 removed from the gate poly and floating diffusion for even lower leakage behavior.

FIG. 3C illustrates a top plan view of the CMOS imager 10' of FIG. 2 having silicide surface layers removed from the photodiode 20, gate poly regions 70a, 70b and floating diffusion node 30.

Unfortunately, however, with the absence of the silicide from imagers with a transfer gate with n and p regions, each CMOS APS cell gate polysilicon formed with the built-in diode within the gate prevents the entire gate from being contacted. That is, a contact which only connects either the n-type or p-type side of the polysilicon gate will not be adequately connected to the other polarity of the gate poly layer. This results in a time dependent voltage on the uncontacted portion of the gate. That is, if a contact is made to the n-type part of the gate, the p-type part floats; likewise, if contact is made to the p-type side of the gate, the n-type part floats. If a contact is formed directly over the boundary edge, contact overlay allows it to contact only one side statistically.

It would thus be highly desirable to provide a CMOS image sensor array including a novel APS cell structure that exhibits reduced (low) lag and dark current and, that eliminates bright spikes leakage phenomena.

SUMMARY OF THE INVENTION

The invention relates generally to improved semiconductor imaging devices and in particular to an imaging device which can be fabricated using a standard CMOS process.

The present invention is directed to a CMOS image sensor wherein the sensor comprises a photodetecting region (e.g. photodiode); a floating diffusion; a transfer gate located between the photodetecting region and the floating diffusion, the transfer gate comprising n and p type doped regions to from a diode; and, an interconnect layer (e.g. a silicide structure) electrically coupling the n-type and p-type doped regions of the transfer gate.

In an embodiment of the invention, the interconnect layer comprises a silicide and is formed in physical contact with at least a portion of the p-type region and a portion of the n-type region of a polysilicon transfer gate. The silicide layer may be over all or just a portion of the poly gate width and silicide is not formed on the diffusions (i.e. photodiode and floating diffusion).

Preferably, the CMOS imager of the invention including a transfer gate device having two workfunctions (n-type and p-type gate poly) and a silicide strap cooperatively exhibit a high barrier at the photodiode for dark current while a low barrier is provided at the floating diffusion for low lag performance. The silicide strap prevents the diodic behavior from allowing one or the other side of the gate to float to an indeterminate voltage.

Thus, according to one aspect of the invention, there is provided an active pixel sensor (APS) cell structure and method of manufacture. The active pixel sensor (APS) cell structure comprises:

a substrate of a first conductivity type material;

a transfer gate device comprising a gate dielectric layer formed on the substrate and a dual workfunction gate conductor layer formed on the gate dielectric layer, the dual workfunction gate conductor layer comprising a first doped region of first conductivity type material and a second doped region of a second conductivity type material;

a photosensing device formed at or below a substrate surface adjacent the first doped region of the transfer gate device for collecting charge carriers in response to light incident thereto;

a diffusion region of a second conductivity type material formed at the substrate surface adjacent the second doped region of the transfer gate device, the transfer gate device forming a channel region enabling charge transfer between the photosensing device and the diffusion region; and, a silicide structure formed atop the dual workfunction gate conductor layer for electrically coupling the first doped region of first conductivity type material of the transfer gate device and the second doped region of second conductivity type material of the transfer gate device.

In one embodiment, the photosensing device comprises a photodiode comprising:

a collection well of a second conductivity type material formed below the substrate surface; and, a pinning layer of the first conductivity type material formed atop the collection well at the substrate surface.

In one embodiment, the substrate, pinning layer of the first conductivity type material, and the first doped region of the dual workfunction gate conductor layer of the transfer gate device includes p-type dopant material, e.g., Boron or Indium. The collection well of the second conductivity type material, the floating diffusion region of second conductivity type material, and the second doped region of the dual workfunction gate conductor layer of the transfer gate includes n-type dopant material, e.g., Phosphorus, Arsenic or Antimony.

Moreover, the silicide structure comprises a silicide of Ti, Ta, W, Co, Ni, Pt, Pd or alloys thereof.

In one embodiment, the silicide structure formed over the dual workfunction gate conductor layer for electrically coupling the first doped region of first conductivity type material and the second doped region of second conductivity type material of the transfer gate device is smaller in area dimension than an area dimension of the dual workfunction gate conductor layer.

Alternately, the silicide structure formed over the dual workfunction gate conductor layer for electrically coupling the first doped region of first conductivity type material and the second doped region of second conductivity type material of the transfer gate device is reduced only in length dimension than a length of the dual workfunction gate conductor layer.

Given that the transfer gate device defines a conducting channel region where charge transfer is enabled between the collection well and the floating diffusion region underneath the transfer gate device, in a further alternate embodiment, the silicide structure is formed atop the dual workfunction gate conductor layer for electrically coupling the first doped region of first conductivity type material and the second doped region of second conductivity type material of the transfer gate device outside of the area defining the conducting channel region.

Advantageously, the teachings of the invention may be applicable for devices of both polarities, i.e., n type photodiodes and p type pinning layers and nFETS, as well as to p type photodiodes, and n type pinning layers with pFETs.

BRIEF DESCRIPTION OF THE DRAWINGS

The objects, features and advantages of the present invention will become apparent to one skilled in the art, in view of the following detailed description taken in combination with the attached drawings, in which:

FIG. 1 depicts a CMOS Active Pixel Sensor (APS) cell 10 for an image sensor according to the prior art;

FIG. 2 illustrates, through a cross-sectional view, a CMOS Active Pixel Sensor (APS) cell 10' according to the prior art having a gate polysilicon layer with a built in diode, e.g., a pn junction;

FIGS. 3A and 3B illustrate, through cross-sectional views, the CMOS Active Pixel Sensor (APS) cell 12 having silicide contacts regions removed from the photodiode (FIG. 3A) and having silicide surface layer contact regions removed from the gate poly layer and floating diffusion layer in accordance with the prior art (FIG. 3B);

DETAILED DESCRIPTION OF PREFERRED EMBODIMENTS

Prior to describing the present invention in detail, it is instructive to note that the present invention is preferably used in, but not limited to, a CMOS active pixel sensor. Active pixel sensor (APS) refers to an active electrical element within the pixel, other than transistors functioning as switches. For example, the floating diffusion or amplifier are active elements. CMOS refers to complementary metal oxide silicon type electrical components such as transistors which are associated with the pixel, but typically not in the pixel, and which are formed when the source/drain of a transistor is of one dopant type and its mated transistor is of the opposite dopant type. CMOS devices include some advantages one of which is it consumes less power.

Figure 3C:
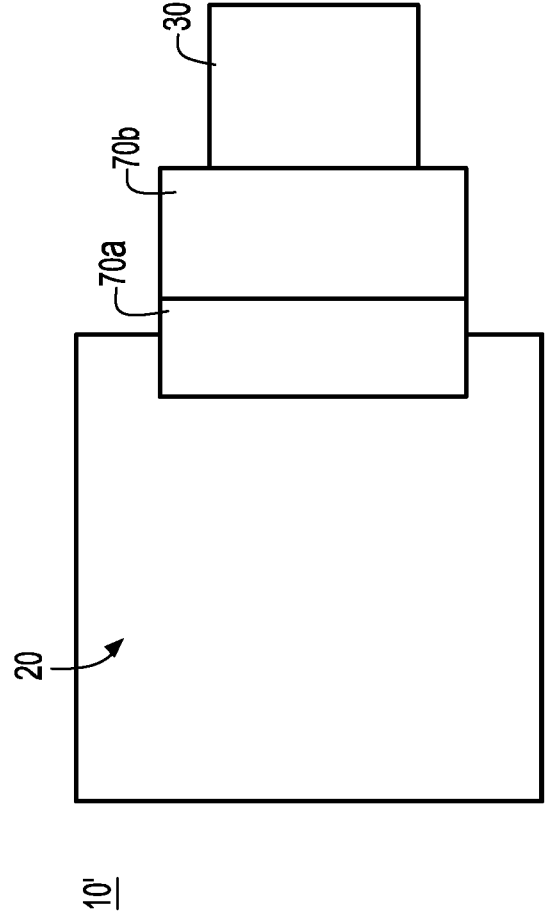
FIG. 3C illustrates a top plan view of the CMOS imager 10' of FIG. 2 having silicide surface layers removed from the photodiode 20, gate poly regions 70a, 70b and floating diffusion node 30.
Figure 4:
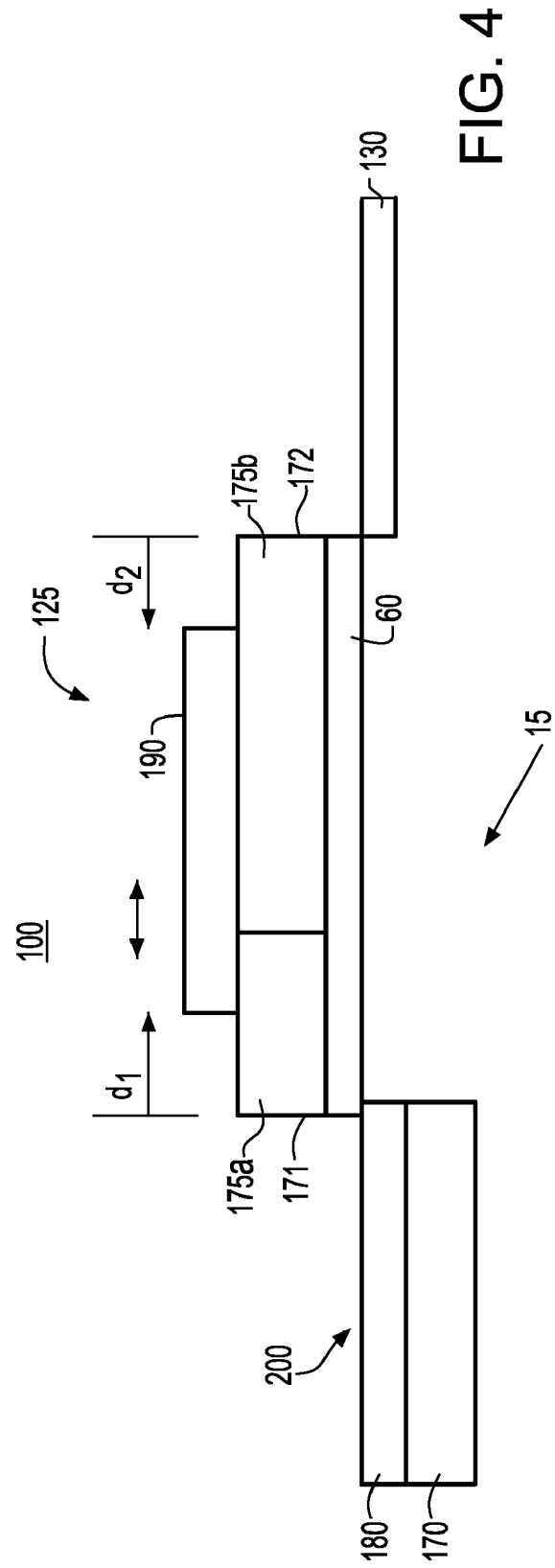
FIG. 4 illustrates, through a cross-sectional view, a CMOS APS cell 100 having silicide contacts regions removed from the photodiode and floating node diffusion regions and, having a partial conductive strap formed on the gate polysilicon for improved gate barrier ac characteristics according to a first embodiment of the invention.

FIG. 4 illustrates, through a cross-sectional view, a back end of line CMOS imager APS 100 including photosensing device, e.g., photodiode 200, and silicon-containing, e.g., polysilicon, transfer gate 125 according to a first embodiment of the invention. The polysilicon transfer gate 125 includes an anodic (p-type doped) region and abutting cathodic (n-type doped) region forming a diode. In one non-limiting example, the polysilicon transfer gate 125 comprises a Schottky diode. Further, as shown in FIG. 4, a conductive structure, e.g., a partial silicide "strap" 190, is formed on the surface of the poly gate having p-type 175a and n-type 175b portions for improved gate barrier ac characteristics as will be described in greater detail herein below. As shown in FIG. 4, the partial silicide strap layer 190 electrically connects the p-type doped 175a and n-type doped 175b portions of the polysilicon gate 125. Moreover, as shown in FIG. 4, the partial silicide "strap" layer 190 has edges formed at a distance from the boundary of the gate, i.e., the silicide strap 190 is inset a distance, e.g., distances $d_1$ and $d_2$, from respective edges 171, 172 of the poly gate layer. The inset distances $d_1$ and $d_2$ of the formed silicide strap are not required to be equal, i.e., the strap is formed to lie over just a portion of the poly width, as long as the silicide strap 190 electrically shorts the p-type portion 175a to the n-type portion 175b. Thus, as shown in the top view of FIG. 5A, the silicide strap 190 is formed atop a portion of the poly width. It is understood that in preferred embodiments, the silicide strap 190 is kept off the diffusion 130.

Although not shown, one example methodology for producing the CMOS imager APS 100 structure shown in FIG. 4 is now described. It is understood that other techniques may be used for forming the transfer gate having the diode structure, i.e., abutting p-type and n-type gate poly regions, as known in the art. The device 100 is formed on a substrate 15 which may be a bulk semiconductor including, for example, Si, SiGe, SiC, SiGeC, GaAs, InP, InAs and other semiconductors, or layered semiconductors such as silicon-on-insulators (SOI), SiC-on-insulator (SiCOI) or silicon germanium-on-insulators (SGOI). For purposes of description, substrate 15 is a Si-containing semiconductor substrate of a first conductivity type, e.g., lightly doped with p-type dopant material such as boron or indium (beryllium or magnesium for a III-V semiconductor), to a standard concentration ranging between, e.g., $1 \times 10^{14}$ to $1 \times 10^{16}$ cm$^{-3}$. Next a dielectric material layer 60 is formed by standard deposition/growth techniques atop the substrate 15 that will form the eventual transfer gate dielectric. The dielectric layer may be formed to a thickness ranging between 40 Å to 100 Å, for example, and may comprise suitable gate dielectric materials including but not limited to: an oxide (e.g., SiO$_2$), a nitride (e.g., silicon nitride) an oxynitride (e.g, Si oxynitride), N$_2$O, NO, ZrO$_2$, or other like materials. In one embodiment, the gate dielectric 60 is comprised of an oxide such as, for example, SiO$_2$, HfO$_2$, ZrO$_2$, Al$_2$O$_3$, TiO$_2$, La$_2$O$_3$, SrTiO$_3$, LaAlO$_3$, and mixtures thereof. The dielectric layer 60 is formed on the surface of the Si-containing semiconductor substrate 15 using conventional thermal oxidation or by a suitable deposition process such as chemical vapor deposition, plasma-assisted chemical vapor deposition, atomic layer deposition (ALD), evaporation, reactive sputtering, chemical solution deposition and other like deposition processes. The gate dielectric 16 may also be formed utilizing any combination of the above processes. Although it is not shown, it is understood that the dielectric layer may comprise a stack of dielectric materials.

Next, a Silicon-containing layer, e.g., polycrystalline silicon, is formed atop the dielectric layer 60 using conventional deposition processes including, but not limited to: CVD, plasma-assisted CVD, sputtering, plating, evaporation and other like deposition processes (e.g., a low pressure CVD). The polysilicon layer may be formed to a thickness ranging between about 1 kÅ to 2 kÅ but may be outside this range. Alternatively, the Silicon-containing layer may comprise a stack of polysilicon layers. The transfer gate 125 is then formed by a photolithographic process, e.g., applying a mask, e.g., a photoresist layer, over the polysilicon layer and applying a mask patterned to define the gate region, e.g., length determining an effective channel length of the transfer gate to be formed, and then developing the resist and performing an etch process. Basically, an etch window is provided in a resist mask, the size and shape of which approximately defining the lateral size and shape of the gate region to be formed. Then, one or more etch processes are performed, e.g., a reactive ion etch (RIE) process, that is optimized to ensure proper etching of the polysilicon layer and dielectric layer 60 or dielectric layer stack to result in the transfer gate structure.

After forming the transfer gate structure including the intrinsic polysilicon layer on the gate dielectric layer, a subsequent mask deposition process that covers a portion of the transfer gate structure and ion implantation process is performed to implant dopant material of a second conductivity type, e.g., n-type dopant material, such as phosphorus, arsenic or antimony, into the polysilicon layer to form n-type doped gate poly portion 175b. The n-type dopant material may be implanted to achieve a dosing concentration ranging between $1 \times 10^{17}$ cm$^{-3}$ to $1 \times 10^{20}$ cm$^{-3}$. Similarly, using a subsequent mask deposition process that covers the remaining portion, i.e., the other side of the transfer gate structure, an ion implantation process is performed to implant dopant material of a first conductivity type, e.g., p-type dopant material, such as boron or gallium or indium into the polysilicon layer to form p-type doped gate poly portion 175a as shown in FIG. 4. The p-type dopant material may be implanted to achieve a dosing concentration ranging between $1 \times 10^{17}$ cm$^{-3}$ to $1 \times 10^{20}$ cm$^{-3}$ in the gate poly. Alternately, the doping of the polysilicon may be achieved using implants already present in the process by appropriate use of those implant masks at the same time those implants are being performed elsewhere in the chip. (One example would be the source drain implants and masks, but others are also possible.)

It should be noted that in a variation of the method described, in-situ n-type, p-type doped, or both n-type and p-type polysilicon material may be deposited on top of the gate dielectric layer 60 according to an in-situ doping deposition process or deposition (e.g., CVD, plasma-assisted, etc.). The in-situ doping deposition process, for example, may be employed when the gate dielectric cannot withstand a subsequent high temperature annealing, whereas ion implantation and annealing can be employed when the gate dielectric is a material that can withstand such high temperature annealing.

In a further optional step, gate sidewall spacers (not shown) may be formed at either side of the transfer gate by conventional deposition processes well known in the art, and may comprise any conventional oxide or nitride (e.g., $Si_3N_4$) or oxide/nitride which are then etched by RIE or another like etch process. The thickness of spacers may vary, but typically they have a thickness of from about 5 nm to about 150 nm.

After optionally forming transfer gate sidewall spacers, a next step is performed to provide the photodiode pinning region 180. This step comprises forming a photoresist layer (not shown) patterning, and creating an ion implantation mask according to techniques known in the art to form a mask edge approximately coincident with the gate edge or as close as possible given alignment tolerances, to provide an opening to an area between an edge of the gate and a formed isolation region, e.g., STI region (not shown), where the charge accumulation region of the photodiode is to be formed. This opening permits the implantation of ions of p-type dopant material, e.g., such as boron, at a concentration sufficient to form the p-type dopant pinning region 180 as shown in FIG. 4. This pinning region 180 may be formed up to the edge of a spacer (not shown). The active p-type dopant material is then ion implanted at dosing concentrations ranging between $1\times10^{17}$ and $1\times10^{19}$ $cm^{-3}$. It should be understood that, alternatively, the p-type pinning photodiode surface layer 180 may be formed by other known techniques. For example, the p-type surface layer 180 may be formed by a gas source plasma doping process, or by diffusing a p-type dopant from the in-situ doped layer or a doped oxide layer deposited over the area where photodiode is to be formed.

A further step is then performed to ion implant the n-type dopant underneath the p-type doped region 180 of the substrate surface of the photodiode element 200. Potentially, the same ion implantation mask could be used as when implanting the p-type material to form pinning region, an ion implantation process is performed to implant dopant material of the second conductivity type, e.g., n-type dopant material, such as phosphorus, arsenic or antimony, to form the charge collection layer beneath the ion implanted p-type pinning layer 180. The n-type dopant material is implanted at higher energy levels to form the n-type doped region 170 of the photodiode 200 as shown in FIG. 4. The active n-type dopant material may be ion implanted at dosing concentrations ranging between $1\times10^{16}$ and $1\times10^{18}$ $cm^{-3}$. As shown in FIG. 4, the photosensitive charge storage region 170 for collecting photo-generated electrons may be formed by multiple implants to tailor the profile of the n-type region 170.

In addition to the forming of the photodiode 200, an additional step of forming an n-type floating diffusion region 130 at the other side of the transfer gate is performed. This step comprises forming a photoresist layer and patterning and etching an ion implantation mask according to techniques known in the art to form a mask edge approximately coincident with the gate edge or as close as possible given alignment tolerances, to provide an opening allowing the implantation of n-type dopant material, such as phosphorus, arsenic or antimony, at a concentration sufficient to form the n+-type doped floating diffusion region 130 as shown in FIG. 4 or, up to the edge of a gate sidewall spacer (not shown). The active n+-type dopant material is ion implanted at the floating diffusion region at dosing concentrations ranging between $1\times10^{18}$ and $1\times10^{20}$. As a result of this ion implantation step, n-type dopant materials may be additionally implanted at the doped transfer gate polysilicon layer 175b portion as well.

A salicide process is then performed to consume the polysilicon gate 125 to form the metal silicide strap 190 according to the invention, as shown in FIGS. 5A-5D.

The first step of the salicide process includes first forming on the p-type doped 175a and n-type doped 175b polysilicon gate layer, a blanket insulative cap using well known deposition techniques. For example, a dielectric cap layer is formed atop the polysilicon gate layer 175a,b utilizing a deposition process such as, for example, physical vapor deposition or chemical vapor deposition. The dielectric cap layer may be an oxide, nitride, oxynitride or any combination thereof. In one embodiment, a nitride such as, for example, $Si_3N_4$, is employed as the dielectric cap layer. The thickness, i.e., height, of the dielectric cap layer may range from about 20 nm to about 180 nm.

Figure 5A:
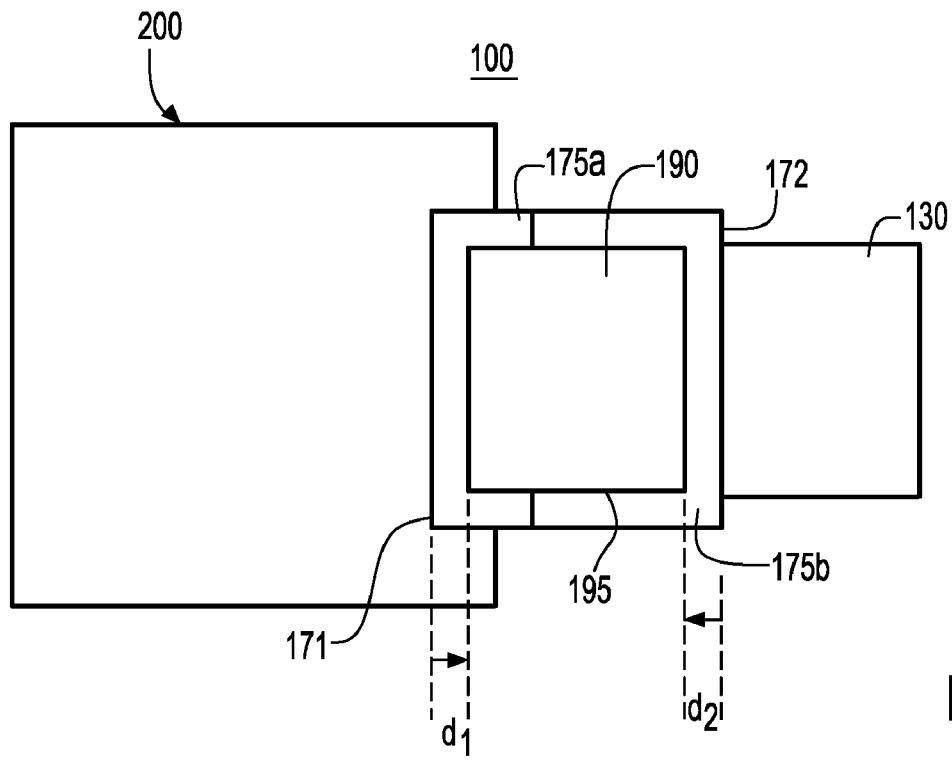
FIG. 5A illustrates, through a top plan view, the CMOS APS cell 100 formed in accordance with the embodiment of the invention shown in FIG. 4.

Then, using typical lithographic steps, i.e., forming a patterned resist mask over the cap (e.g., nitride) dielectric layer, an area is etched that outlines the silicide strap to be formed. The lithography step includes applying a photoresist to the upper surface of the dielectric cap layer, exposing the photoresist to a desired pattern of radiation and developing the exposed photoresist utilizing a conventional resist developer. The pattern in the photoresist is then transferred to the dielectric cap layer utilizing one or more dry etching steps leaving exposed the underlying polysilicon gate layer and, particularly, opening up a window in the dielectric cap layer to expose adjacent portions of both doped regions 175a,b in the exposed underlying polysilicon layer. In accordance with the present invention, the desired pattern is the area and dimension of the silicide strap to be formed such as shown in FIGS. 5A-5D. Thus, for example, as shown in the top plan view of the invention as shown in FIG. 5A, the photolithographic mask, develop and etch process applied to the overlying cap dielectric (e.g., nitride) layer (not shown) will result in the exposure region 195 of the underlying polysilicon layer that is inset a distance d1 and d2 from each of the respective gate edges 171, 172 along the length of the gate that will be subject to formation of the silicide contact. In some embodiments, the patterned photoresist may be removed after the pattern has been transferred into the dielectric cap layer.

Suitable dry etching processes that can be used in the present invention in forming the patterned gate include, but are not limited to: reactive ion etching, ion beam etching, plasma etching or laser ablation.

Then there is next performed the step of depositing a silicide metal (not shown) in the etched out patterned nitride layer such that the exposed underlying polysilicon layer becomes filled with the silicide metal. The metal used in forming the silicide strap comprises any metal that is capable of reacting with silicon to form a metal silicide. Examples of such metals include, but are not limited to: Ti, Ta, W, Co, Mo, Ni, Pt, Pd or alloys thereof. The metal may be deposited using any conventional deposition process including, for example, sputtering, chemical vapor deposition, a physical vapor deposition (PVD) of the silicide evaporation, chemical solution deposition, plating and the like.

After deposition of the silicide metal on the exposed polysilicon region defining dimensions of the silicide strap 190, a thermal anneal process is employed to form a silicide phase in the structure; preferably, the silicide representing the lowest resistivity phase of a metal silicide. The anneal is performed utilizing the ambients and temperatures well known in the art that cause the silicide metal to react with the underlying polysilicon to form the metal silicide layer 190 as shown in FIG. 4. In one embodiment, the silicide metal may comprise Co noting that $CoSi_2$ forms using a two step annealing process as known in the art. In another embodiment of the present invention, the silicide metal is Ni or Pt; NiSi and PtSi being formed using a single annealing step. Then, a selective wet etch step may be employed to remove any non-reactive silicide metal from the structure.

In one embodiment, the wafer is then annealed at approximately 500° C. to about 800° C. for approximately 30 seconds in a nitrogen environment to react with the portions of the polysilicon layer 175a,b to form the conductive silicide strap 190.

After completion of the inventive metal silicide gate processing mentioned above, the conventional approach for building an interconnect structure for transistor to transistor and transistor to external contacts can be employed.

Figure 5B:
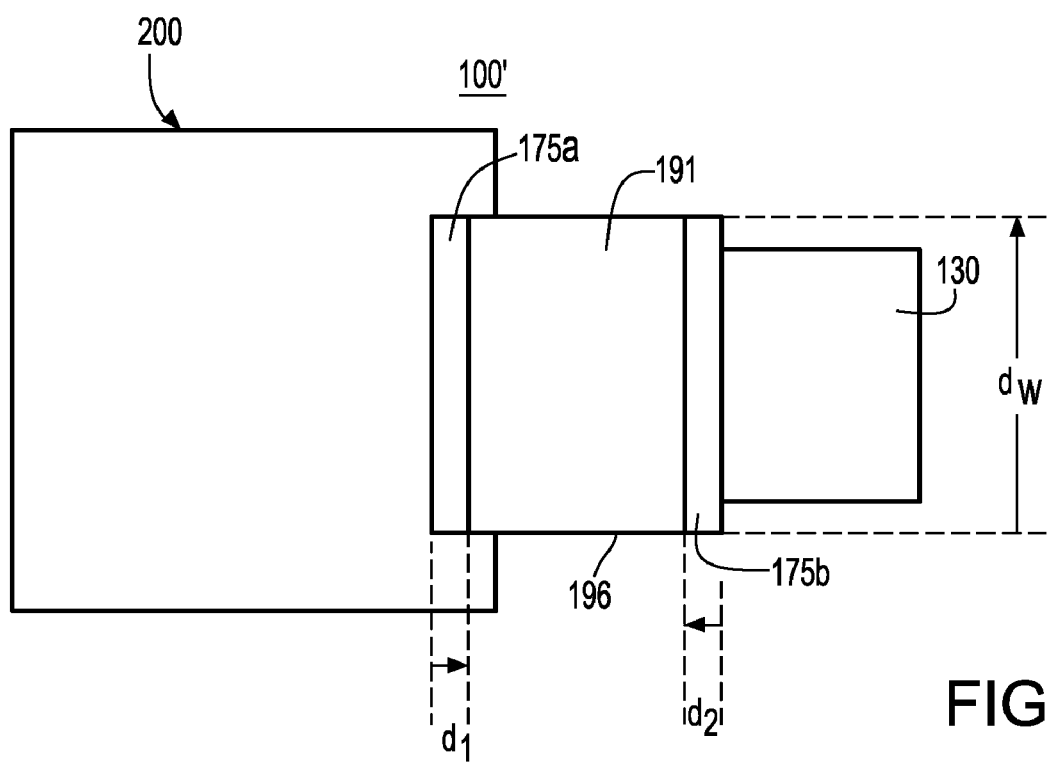
FIG. 5B illustrates, through a top plan view, the CMOS APS cell 100' formed in accordance with a first variation of the embodiment of the invention shown in FIG. 4.

FIG. 5B illustrates, through a top plan view, the CMOS APS cell 100' formed in accordance with a first variation of the embodiment of the invention shown in FIG. 5A, where a silicide strap 191 is formed utilizing the process described herein that has edges formed an inset distance $d_1,d_2$ from edges of the boundary gate, however, is formed to extend substantially over the whole width of the poly. Thus, for example, referring to the salicide process described herein with respect to FIG. 5A, as shown in FIG. 5B, the photolithographic mask, develop and etch process applied to the overlying cap dielectric (e.g., nitride) layer (not shown) will result in formation of the exposure region 196 of the underlying polysilicon layer that is inset a distance d1 and d2 from each of the respective gate edges 171, 172 along the length of the gate, however extends to both edges of the poly layer width a distance, dw, for example.

Figure 5C:
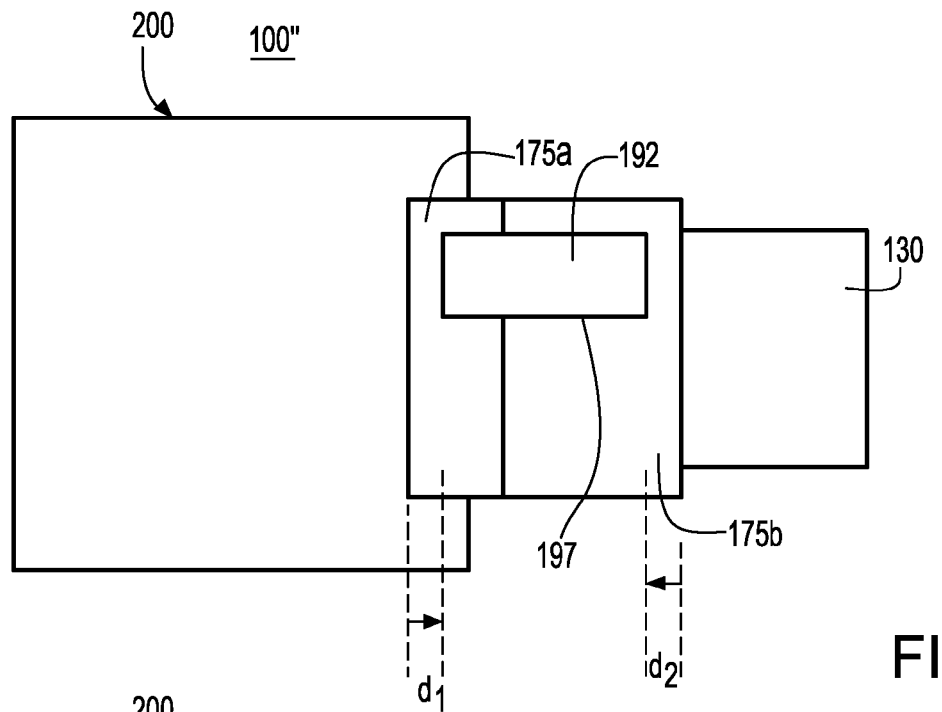
FIG. 5C illustrates, through a top plan view, the CMOS APS cell 100" formed in accordance with a second variation of the embodiment of the invention shown in FIG. 4.

FIG. 5C illustrates, through a top plan view, the CMOS APS cell 100'' formed in accordance with a second variation of the embodiment of the invention shown in FIG. 5A, where a silicide strap 192 is formed utilizing the process described herein that has edges formed an inset distance $d_1,d_2$ from edges of the boundary gate, however, extends a short distance of the poly gate. Thus, for example, referring to the salicide process described herein with respect to FIG. 5A, as shown in FIG. 5C, the photolithographic mask, develop and etch process applied to the overlying cap dielectric (e.g., nitride) layer (not shown) will result in formation of the exposure region 197 of the underlying polysilicon layer that is inset a distance d1 and d2 from each of the respective gate edges 171, 172 along the length of the gate, however extends for only a short distance of the poly gate, for example.

Figure 5D:
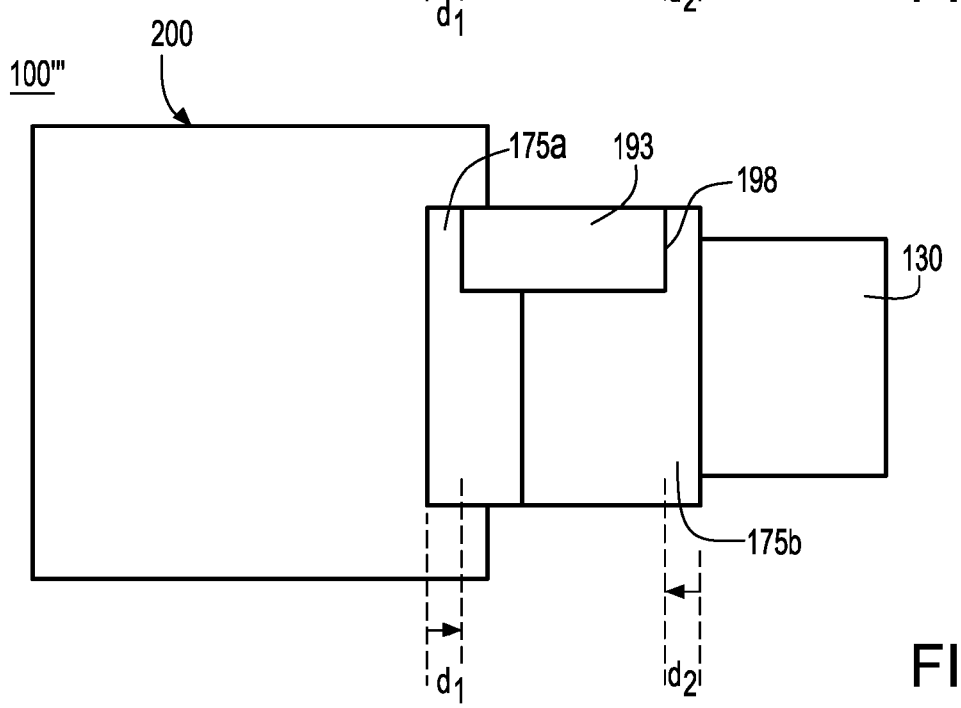
FIG. 5D illustrates, through a top plan view, the CMOS APS cell 100'" formed in accordance with a third variation of the embodiment of the invention shown in FIG. 4; and, FIG. 6 is a side view of a camera device implementing an image sensor having the CMOS Active Pixel Sensor (APS) cells formed in accordance with the present invention.

In accordance with a further embodiment of the invention, the silicide strap for the CMOS imager APS transfer gate may be made on a portion of the polysilicon gate that is not directly over the conducting channel (i.e., as long as the n and p regions are shorted by the strap somewhere). FIG. 5D illustrates, through a top plan view, the CMOS APS cell 100''' formed in accordance with a third variation of the embodiment of the invention shown in FIG. 5A, where a silicide strap 193 is formed utilizing the process described herein that has edges formed an inset distance from edges of the boundary gate, and that extends a short distance of the poly gate. However, the strap 193 is offset from that portion of the gate 175a,b that defines the channel region for the transfer device. That is, the silicide strap 193 is formed on a portion of the polysilicon gate that is not directly over the conducting channel. Thus, for example, referring to the salicide process described herein with respect to FIG. 5A, as shown in FIG. 5D, the photolithographic mask, develop and etch process applied to the overlying cap dielectric (e.g., nitride) layer (not shown) will result in formation of the exposure region 198 of the underlying polysilicon layer that is inset a distance from each of the respective gate edges 171, 172 along the length of the gate, and extends for only a short distance of the poly gate, for example, in a region that does not directly overly the device channel region.

It is understood that any conductive structure for electrically shorting the anode 175a and cathode 175b portions of the transfer gate poly may be implemented besides the silicide contact structure as described. However, it is imperative that the photodetection region and the floating diffusion regions be silicide-free.

Benefits of the structures shown and described herein with respect to FIGS. 5A-5D are that a high barrier exists at the photodiode for reducing the dark current leakage, and that a low barrier is present at the floating diffusion for lower lag. The silicide strap prevents diodic behavior from allowing one or the other side of the gate to float to an indeterminate voltage.

Figure 6:
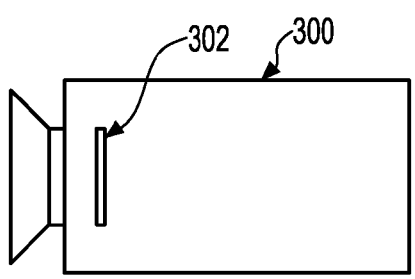

Referring to FIG. 6, there is shown a side view of a camera device 300 implementing an image sensor 302 having the CMOS Active Pixel Sensor (APS) cells 100-100''' formed in accordance with the respective embodiments of the invention depicted in FIGS. 5A-5D.

While there has been shown and described what is considered to be preferred embodiments of the invention, it will, of course, be understood that various modifications and changes in form or detail could readily be made without departing from the spirit of the invention. For example, while the preferred embodiments described herein were directed to n type photodiodes and p type pinning layers and nFETS, the principles of the present invention may advantageously be applied to p type photodiodes, and n type pinning layers with pFETs. It is therefore intended that the invention be not limited to the exact forms described and illustrated, but should be constructed to cover all modifications that may fall within the scope of the appended claims.

Having thus described our invention, what we claim as new, and desire to secure by Letters Patent is:

1. An active pixel sensor (APS) cell structure comprising:
a substrate of a first conductivity type material;
a transfer gate device comprising a gate dielectric layer formed on the substrate and a dual workfunction gate conductor layer formed on the gate dielectric layer, said dual workfunction gate conductor layer comprising a first doped region of first conductivity type material and a second doped region of a second conductivity type material;
a photosensing device formed at or below a substrate surface adjacent said first doped region of said transfer gate device for collecting charge carriers in response to light incident thereto;
a diffusion region of a second conductivity type material formed at said substrate surface adjacent said second doped region of said transfer gate device, said transfer gate device forming a channel region enabling charge transfer between said photosensing device and said diffusion region; and,
a silicide structure formed atop said dual workfunction gate conductor layer for electrically coupling said first doped region of first conductivity type material of said transfer gate device and said second doped region of second conductivity type material of said transfer gate device, wherein said silicide structure formed over said dual workfunction gate conductor layer for electrically coupling said first doped region of first conductivity type material and said second doped region of second conductivity type material of said transfer gate device is smaller in area dimension than an area dimension of said dual workfunction gate conductor layer.

2. The APS cell structure as claimed in claim 1, wherein said photosensing device comprises a photodiode comprising:
  a collection well of a second conductivity type material formed below said substrate surface; and,
  a pinning layer of said first conductivity type material formed atop the collection well at said substrate surface.

3. The APS cell structure as claimed in claim 2, further comprising an isolation region formed adjacent to said pinning layer and collection well.

4. The APS cell structure as claimed in claim 2, wherein said substrate, said pinning layer of said first conductivity type material, and said first doped region of said dual workfunction gate conductor layer of said transfer gate includes p-type dopant material.

5. The APS cell structure as claimed in claim 4, wherein said p-type dopant material comprises one of Boron or Indium.

6. The APS cell structure as claimed in claim 2, wherein said collection well of said second conductivity type material, said diffusion region of second conductivity type material, and said second doped region of said dual workfunction gate conductor layer of said transfer gate includes n-type dopant material.

7. The APS cell structure as claimed in claim 6, wherein said n-type dopant material comprises one of Phosphorus, Arsenic or Antimony.

8. The APS cell structure as claimed in claim 6, wherein said dual workfunction gate conductor layer of said transfer gate device comprises a diode.

9. The APS cell structure as claimed in claim 2, wherein underneath said transfer gate device is disposed a conducting channel region where charge transfer is enabled between said collection well and said diffusion region, said silicide structure being formed atop said dual workfunction gate conductor layer for electrically coupling said first doped region of first conductivity type material and said second doped region of second conductivity type material of said transfer gate device outside of said area defining said conducting channel region.

10. The APS cell structure as claimed in claim 1, wherein said silicide structure comprises a silicide of Ti, Ta, W, Co, Ni, Pt, Pd or alloys thereof.

11. The APS cell structure as claimed in claim 1, wherein said silicide structure formed atop said dual workfunction gate conductor layer for electrically coupling said first doped region of first conductivity type material and said second doped region of second conductivity type material of said transfer gate device is reduced in length dimension than a length of said dual workfunction gate conductor layer.

12. A CMOS image sensor array of pixels, each pixel including an active pixel sensor (APS) cell structure comprising:
  a substrate of a first conductivity type material;
  a transfer gate device comprising a gate dielectric layer formed on the substrate and a dual workfunction gate conductor layer formed on the gate dielectric layer, said dual workfunction gate conductor layer comprising a first doped region of first conductivity type material and a second doped region of a second conductivity type material;
  a photosensing device formed at or below a substrate surface adjacent said first doped region of said transfer gate device for collecting charge carriers in response to light incident thereto;
  a diffusion region of a second conductivity type material formed at said substrate surface adjacent said second doped region of said transfer gate device, said transfer gate device forming a channel region enabling charge transfer between said photosensing device and said diffusion region; and,
  a silicide structure formed atop said dual workfunction gate conductor layer for electrically coupling said first doped region of first conductivity type material of said transfer gate device and said second doped region of second conductivity type material of said transfer gate device,
  wherein said silicide structure formed over said dual workfunction gate conductor layer for electrically coupling said first doped region of first conductivity type material and said second doped region of second conductivity type material of said transfer gate device is smaller in area dimension than an area dimension of said dual workfunction gate conductor layer.

13. The CMOS image sensor array of pixels as claimed in claim 12, wherein said silicide structure formed atop said dual workfunction gate conductor layer of said APS cell structure is reduced in length dimension than a length of said dual workfunction gate conductor layer.

14. A camera device comprising:
  an image sensor array of pixels, each pixel including an active pixel sensor (APS) cell structure, each said APS cell structure comprising:
    a substrate of a first conductivity type material;
    a transfer gate device comprising a gate dielectric layer formed on the substrate and a dual workfunction gate conductor layer formed on the gate dielectric layer, said
  dual workfunction gate conductor layer comprising a first doped region of first conductivity type material and a second doped region of a second conductivity type material;
    a photosensing device formed at or below a substrate surface adjacent said first doped region of said transfer gate device for collecting charge carriers in response to light incident thereto;
    a diffusion region of a second conductivity type material formed at said substrate surface adjacent said second doped region of said transfer gate device, said transfer gate device forming a channel region enabling charge transfer between said photosensing device and said diffusion region; and,
    a silicide structure formed atop said dual workfunction gate conductor layer for electrically coupling said first doped region of first conductivity type material of said transfer gate device and said second doped region of second conductivity type material of said transfer gate device,
  wherein said silicide structure formed over said dual workfunction gate conductor layer for electrically coupling said first doped region of first conductivity type material and said second doped region of second conductivity type material of said transfer gate device is smaller in area dimension than an area dimension of said dual workfunction gate conductor layer.

15. The camera device as claimed in claim 14, wherein said photosensing device comprises a photodiode comprising:
  a collection well of a second conductivity type material formed below said substrate surface; and,
  a pinning layer of said first conductivity type material formed atop the collection well at said substrate surface.

16. The camera device as claimed in claim 15, further comprising an isolation region formed adjacent to said pinning layer and collection well.

17. The camera device as claimed in claim 15, wherein said substrate, said pinning layer of said first conductivity type material, and said first doped region of said dual workfunction gate conductor layer of said transfer gate includes p-type dopant material.

18. The camera device as claimed in claim 17, wherein said p-type dopant material comprises one of Boron or Indium.

19. The camera device as claimed in claim 15, wherein said collection well of said second conductivity type material, said diffusion region of second conductivity type material, and said second doped region of said dual workfunction gate conductor layer of said transfer gate includes n-type dopant material.

20. The camera device as claimed in claim 19, wherein said n-type dopant material comprises one of Phosphorus, Arsenic or Antimony.

21. The camera device as claimed in claim 19, wherein said dual workfunction gate conductor layer of said transfer gate device comprises a diode.

22. The camera device as claimed in claim 15, wherein underneath said transfer gate device is disposed a conducting channel region where charge transfer is enabled between said collection well and said diffusion region, said silicide structure being formed atop said dual workfunction gate conductor layer for electrically coupling said first doped region of first conductivity type material and said second doped region of second conductivity type material of said transfer gate device outside of said area defining said conducting channel region.

23. The camera device as claimed in claim 14, wherein said silicide structure comprises a silicide of Ti, Ta, W, Co, Ni, Pt, Pd or alloys thereof.

24. The camera device as claimed in claim 14, wherein said silicide structure formed atop said dual workfunction gate conductor layer for electrically coupling said first doped region of first conductivity type material and said second doped region of second conductivity type material of said transfer gate device is reduced in length dimension than a length of said dual workfunction gate conductor layer.

* * * * *